United States Patent
de Larios et al.

(10) Patent No.: US 7,568,490 B2
(45) Date of Patent: Aug. 4, 2009

(54) METHOD AND APPARATUS FOR CLEANING SEMICONDUCTOR WAFERS USING COMPRESSED AND/OR PRESSURIZED FOAMS, BUBBLES, AND/OR LIQUIDS

(75) Inventors: John M. de Larios, Santa Clara, CA (US); Mike Ravkin, Santa Clara, CA (US); Jeffrey Farber, Delmar, NY (US); Mikhail Korolik, San Jose, CA (US); Fritz Redeker, Fremont, CA (US); Aleksander Owczarz, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 555 days.

(21) Appl. No.: 10/746,114

(22) Filed: Dec. 23, 2003

(65) Prior Publication Data

US 2005/0133060 A1    Jun. 23, 2005

(51) Int. Cl.
*B08B 3/00* (2006.01)

(52) U.S. Cl. ............. 134/102.2; 134/100.1; 134/102.1; 134/137; 134/142; 134/157; 134/99.1; 134/902; 156/345.51; 156/345.55

(58) Field of Classification Search .......... 134/86, 134/99.1, 137, 102.2, 142, 157, 902, 100.1, 134/102.1; 156/345.51, 345.55; 438/689, 438/691, 693
See application file for complete search history.

(56) References Cited

U.S. PATENT DOCUMENTS

| 3,978,176 A | 8/1976 | Voegeli |
| 4,838,289 A | 6/1989 | Kottman et al. |

(Continued)

FOREIGN PATENT DOCUMENTS

JP    S62-119543 A    5/1987

(Continued)

OTHER PUBLICATIONS

Kittle, P.A., "Semiconductor Wafer Cleaning and Drying Using a Foam Medium <http://www.aquafoam.com/papers/NWCWG.pdf>" Sematech Novel Wafer Cleans Working Group Meeting Internet Presentation, Nov. 13, 2001.

(Continued)

*Primary Examiner*—Mikhail Kornakov
*Assistant Examiner*—Stephen Ko
(74) *Attorney, Agent, or Firm*—Brinks Hofer Gilson & Lione

(57) ABSTRACT

An apparatus and method are disclosed in which a semiconductor substrate having a surface containing contaminants is cleaned or otherwise subjected to chemical treatment using a foam. The semiconductor wafer is supported either on a stiff support (or a layer of foam) and foam is provided on the opposite surface of the semiconductor wafer while the semiconductor wafer is supported. The foam contacting the semiconductor wafer is pressurized using a form to produce a jammed foam. Relative movement between the form and the semiconductor wafer, such as oscillation parallel and/or perpendicular to the top surface of the semiconductor wafer, is then induced while the jammed foam is in contact with the semiconductor wafer to remove the undesired contaminants and/or otherwise chemically treat the surface of the semiconductor wafer using the foam.

21 Claims, 8 Drawing Sheets

U.S. PATENT DOCUMENTS

| | | | |
|---|---|---|---|
| 5,048,549 | A | 9/1991 | Hethcoat |
| 5,271,774 | A | 12/1993 | Leenaars et al. |
| 5,464,480 | A | 11/1995 | Matthews |
| 5,705,223 | A | 1/1998 | Bunkofske |
| 5,858,283 | A | 1/1999 | Burris |
| 5,900,191 | A | 5/1999 | Gray et al. |
| 5,944,582 | A * | 8/1999 | Talieh .................. 451/41 |
| 5,945,351 | A | 8/1999 | Mathuni |
| 5,997,653 | A | 12/1999 | Yamasaka |
| 6,152,805 | A * | 11/2000 | Takahashi .................. 451/36 |
| 6,167,583 | B1 | 1/2001 | Miyashita et al. |
| 6,267,125 | B1 | 7/2001 | Bergman et al. |
| 6,272,712 | B1 | 8/2001 | Gockel et al. |
| 6,276,459 | B1 | 8/2001 | Herrick et al. |
| 6,290,780 | B1 | 9/2001 | Ravkin |
| 6,296,715 | B1 | 10/2001 | Kittle |
| 6,386,956 | B1 * | 5/2002 | Sato et al. .................. 451/57 |
| 6,398,975 | B1 | 6/2002 | Mertens et al. |
| 6,418,942 | B1 | 7/2002 | Gray et al. |
| 6,439,247 | B1 | 8/2002 | Kittle |
| 6,491,764 | B2 | 12/2002 | Mertens et al. |
| 6,594,847 | B1 | 7/2003 | Krusell et al. |
| 2002/0094684 | A1 | 7/2002 | Hirasaki et al. |
| 2002/0112312 | A1 | 8/2002 | Lin |
| 2002/0185164 | A1 | 12/2002 | Tetsuka et al. |
| 2002/0195121 | A1 | 12/2002 | Kittle |
| 2003/0075204 | A1 | 4/2003 | de Larios et al. |
| 2003/0171239 | A1 | 9/2003 | Patel et al. |
| 2003/0226577 | A1 * | 12/2003 | Orll et al. .................. 134/1.3 |

FOREIGN PATENT DOCUMENTS

| | | |
|---|---|---|
| JP | 2-280330 | 11/1990 |
| JP | 2-309638 | 12/1990 |
| JP | 5-15857 | 1/1993 |
| JP | H11-350169 A | 12/1999 |
| JP | 2001-328069 * | 11/2001 |
| WO | WO 00/33980 A | 6/2000 |
| WO | WO 00/59006 A | 10/2000 |
| WO | WO 2005/006424 A | 1/2005 |

OTHER PUBLICATIONS

Kittle, P.A., "Particulate Removal Using a Foam Medium <http://www.aquafoam.com/papers/particulate.pdf>" Background summary of surface tension gradient (foam) drying and cleaning of semiconductor wafers Abridged version, "Removing Particles with a Foam Medium <http://www.aquafoam.com/papers/A2C2foammedium.pdf>," A2C2, pp. 11-15, Jan. 2002.

Lester, M.A., "Is Foam Wafer Cleaning and Drying the Future? <http://www.aquafoam.com/papers/SCI0202/pdf>" Semiconductor International, 25, #2 (February), 42 (2002).

Kittle, P.A., "Aqueous Foam Drying and Cleaning of Semiconductor Wafers <http://www.aquafoam.com/papers/SCCPresentation.pdf>" This is a PowerPoint presentation with about 90 slides and many SEM photographs. The presentation covers the major background technology plus the recent experimental work. This is a large file with a very long download time via modem. Apr. 2002.

Kittle, P.A., "Photoresist Residue Removal Using Aqueous Foam <http://www.aquafoam.com/papers/Proof-11MB.pdf>" (as submitted, better, clearer SEMs) A2C2 <papers/A2C2photoresist.pdf>, pp. 13-17, May 2002.

Kittle, P.A., "Semiconductor Wafer Cleaning and Drying Using a Foam Medium," available at http://www.aquafoam.com/papers/NWCWG.pdf (believed to be published prior to Dec. 23, 2003).

Kirkpatrick et al., "Advanced Wafer-Cleaning Evolution," Solid State Technology, May 2003, www.solid-state.com.

Kittle, "Removing Particles with a Foam Medium <http://www.aquafoam.com/papers/A2C2foammedium.pdf," A2C2, pp. 11-15, Jan. 2002.

Weaire et al., "The Physics of Foams," Department of Physics, Trinity College, Dublin, 1999.

Kittle, Paul A.; Small, Robert; Cernat, Mihaela; Patel, Bob; and Hon, Becky; "Photoresist Residue Removal Using Aqueous Foam Proof of Concept Experiments," available at http://www.aquafoam.com/papers/removalall.pdf, created on Oct. 15, 2002. (12 pgs.).

Kittle, Paul A.; Small, Robert; Cernat, Mihaela; and Patel, Bob; "Photoresist Removal Using Aqueous Foam," *Advancing Applications in Contamination Control*, available at http://www.aquafoam.com/papers/a2c2photoresist.pdf, created on Oct. 11, 2002. (7 pgs.).

Hunter, Robert J., "Introduction to Modern Colloid Science," Oxford Science Publications, 1993, pp. 158-161.

International Search Report from corresponding International Patent Application No. PCT/US2004/042831, mailed May 27, 2005.

* cited by examiner

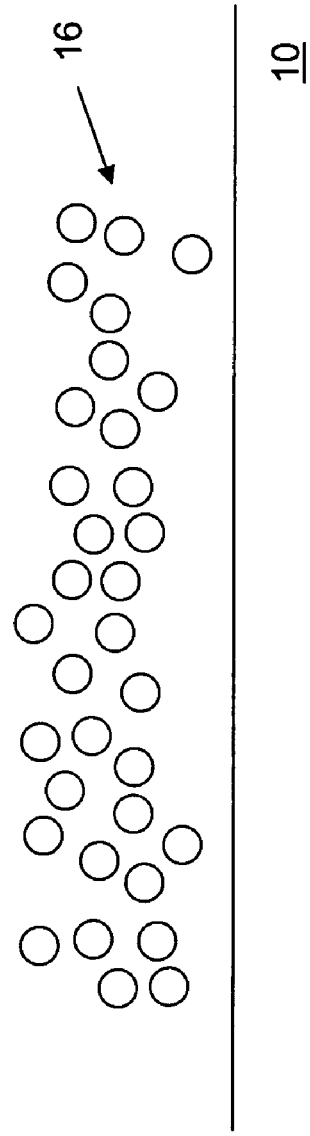
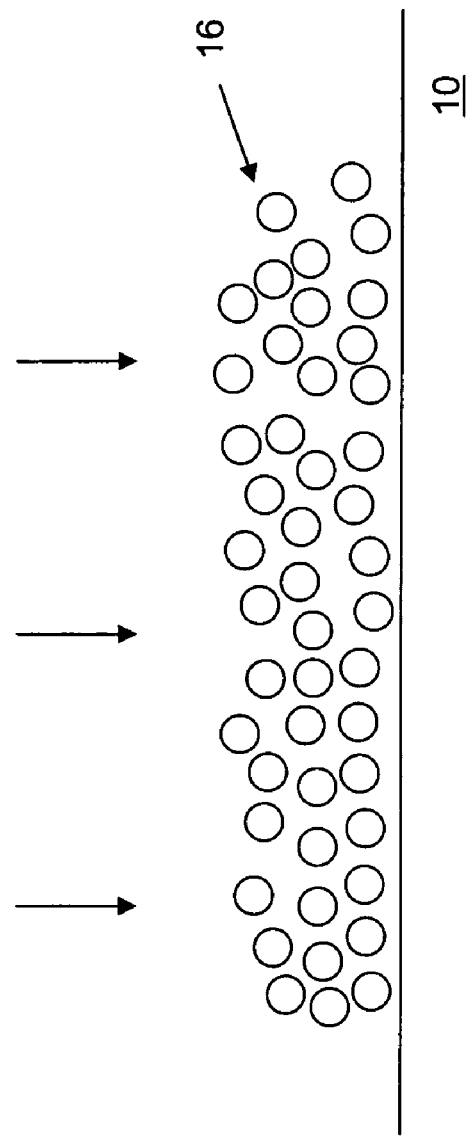

METHOD AND APPARATUS FOR CLEANING SEMICONDUCTOR WAFERS USING COMPRESSED AND/OR PRESSURIZED FOAMS, BUBBLES, AND/OR LIQUIDS

FIELD OF THE INVENTION

The present invention relates to the field of semiconductor wafers. More particularly, the invention relates to a method and apparatus for Cleaning Semiconductor Wafers Using Compressed and/or Pressurized Foams, Bubbles, and/or Liquids.

BACKGROUND

Semiconductor cleaning, chemical treatment and drying technology has been well developed over the last 30 or so years. However, the devices and technology used to perform these processes are extremely expensive. Moreover, with the advent of more advanced lithography and other techniques and more stringent performance requirements of the ultimate design on the semiconductor wafer, the above processing techniques available presently will soon be unable to meet the needed processing requirements.

As above, with the increasing complexity of semiconductor devices, semiconductor wafers are increasingly vulnerable to multiple contamination sources. The sensitivity is due to the submicron feature sizes as well as the decreasing thickness of the deposited layers on the wafer surface. The minimum feature size being designed at present in dense integrated circuits is about 0.11 microns. This will soon shrink to less than a tenth of a micron. As the feature sizes and films become smaller, the allowable contaminant particle size also must be controlled to smaller and smaller dimensions. In general, the contaminant particle size should be about 10 times smaller than the minimum feature size, therefore requiring control of contaminant particulate matter to better than one-one hundredth of a micron (i.e. better than 10 nm).

Such physical dimensions make the eventual product very vulnerable to latent particulate contamination in the environment, both in the air (from the workers and equipment) and the materials used to process the semiconductor. For example, most of the substances used in the cleaning and chemical treatment processes, such as fluorides, solvents, acids, heavy metals, oxidizers, etc., are toxic or otherwise hazardous to both maintain and eliminate. Similarly, the high purity deionized water (DI water) typically used in existing processes is expensive to purchase and dispose of, as well as requiring specialized storage and distribution systems. Chemical treatment and cleaning operations are also sources of contamination. Such contamination results from both surface reactants as well as physical contamination, the latter of which may result from particulate that is delivered to the semiconductor wafer from the chemical treating and cleaning materials themselves no matter the purity of the product or may be transported from the components of the storage and delivery systems.

Furthermore, because semiconductor wafers are manufactured in batch processes and then stored until later processing, rather than being fabricated in a continuous process, they are even more susceptible to this contaminant particulate matter from the environment being introduced to the surface. Moreover, as the semiconductor wafers are dried at the end of each batch process so that they can be safely transported and stored safely, use of isopropyl alcohol, a solvent generally employed during drying of the semiconductor wafer, has become problematic due to its volatile emissions as well as other reasons.

Substances other than DI water and isopropyl alcohol may also be conduits for introducing contaminants to the semiconductor wafer. The contaminants on semiconductor wafer surfaces exist as films, discrete particles or groups of particles and adsorbed gases. These surface films and particles can be molecular compounds, ionic materials or atomic species. Contaminants in the form of molecular compounds are mostly condensed organic vapors from lubricants, greases, photo resists, solvent residues, organic components from deionized water or plastic storage containers, and metal oxides or hydroxides. Contaminants in the form of ionic materials may be cations and anions, mostly from inorganic compounds that may be physically adsorbed or chemically bonded, such as ions of sodium, fluorine and chlorine. Contaminants in the form of atomic or elemental species may be metals, such as copper, aluminum or gold, which may be chemically bonded to the semiconductor surface, or silicon particles or metal debris from equipment used in the processes.

Conventional cleaning technologies used to remove these various contaminants include brush scrubbing or megasonic processing. Although such technologies remove an acceptable amount of contaminants from the semiconductor wafers during processing at present, such methods are ultimately hard on the increasingly delicate structures. The mechanical energy associated with brush scrubbing and megasonic energy damage devices on the semiconductor wafer and introduce device dependent results. Direct contact between the relatively hard surface, like a brush, and the semiconductor wafer can transmit far greater force than necessary to remove the contaminants. Cleaning processes using only megasonic energy produce bubbles and waves that are less damaging to the substrate but may be effective to clean a limited size range of the contaminant particles. Another well known problem of megasonic cleaning is that of cavitation, where bubbles in the megasonic fluid collapse on the surface of the semiconductor wafer and thereby impart energy to the surface of the semiconductor wafer. This energy may destroy delicate/fine structures on the surface or may destroy the surface itself when the bubbles repeatedly collapse at the same location on the surface. In addition to these problems, such conventional techniques may not be able to remove enough contaminants in the future.

Another technology that may be used to clean semiconductor wafers involves using foam rather than a hard surface (brush scrubbing) or megasonic waves to contact the semiconductor surface. As shown in FIG. 1, a semiconductor wafer 100, enclosed within an apparatus 102, has a foam 106 containing bubbles 108 and liquid introduced to the surface of the semiconductor wafer 100 through a port 104. As the foam 106 decays and drains from the surface of the semiconductor wafer 100, the mass of bubbles 106 scrubs particles from the surface of the semiconductor wafer 100. Such a foam process may be improved to provide cleaning to the extent necessary for current or future semiconductor processing.

BRIEF SUMMARY

The instant disclosure provides an apparatus and method for effectively removing contaminants or otherwise treating the semiconductor wafer using an improved foam process involving a pressurized, or "jammed" foam.

In one embodiment, the apparatus includes a support configured to support the semiconductor wafer. A foam manifold is configured to introduce foam to the semiconductor wafer while the semiconductor wafer is supported by the support. A form provides pressure to the foam disposed on a surface of the semiconductor wafer to produce a jammed foam. An actuator effects relative movement between the form and the semiconductor wafer while the jammed foam is in contact with the surface of the semiconductor wafer to remove undesired particles from the surface of the semiconductor wafer.

The form may include a platen disposed on the foam. The platen may have an area at least that of the semiconductor wafer such that the pressure is provided to the foam over the entire surface of the semiconductor wafer. Alternatively, the form may include a pressure structure that is smaller than the entire surface of the semiconductor wafer such that the pressure is provided to the foam in a local area over the surface of the semiconductor wafer. Such a pressure structure may be a mandrel or a wheel.

The foam may include bubbles having a diameter of at most a largest linear dimension of the particles on the surface of the semiconductor wafer. Alternatively, the foam may have a density (the number of bubbles per unit volume) sufficient to permit the bubbles to be rearranged into a first energy state when pressure is applied rather than rupture, in which the first energy state is lower than a second energy state of the foam existing before the pressure was applied. The apparatus may be configured to provide an additional layer of jammed foam between the semiconductor wafer and the support.

The foam may include a liquid and bubbles, the liquid containing a chemical providing a chemical treatment to the semiconductor wafer. The liquid may be configured to etch the semiconductor wafer or a layer disposed on the semiconductor wafer, the liquid may contain cleaning agents suitable to clean the semiconductor wafer, or the liquid may include at least one of HCl, ammonium hydroxide, SC1 (standard clean 1—an ammonium hydroxide-hydrogen peroxide-water mixture typically 0.25:1:5), SC2 (standard clean 2—a hydrochloric acid-hydrogen peroxide-water mixture typically 1:1:5), and HF. The foam may include bubbles that contain a reactive gas.

The actuator may be configured to move the form while a position of the semiconductor wafer is maintained. The actuator may also be configured to vertically oscillate the form such that a distance between the form and the surface of the semiconductor wafer is varied, configured to laterally oscillate the form in the plane of the semiconductor wafer, configured to laterally oscillate the form in a plurality of non-parallel directions, configured to rotate the form, or configured to move the form in a plurality of non-parallel directions.

The actuator may be configured to move the semiconductor wafer while a position of the form is maintained. The actuator may be configured to laterally oscillate the semiconductor wafer, configured to laterally oscillate the semiconductor wafer in a plurality of non-parallel directions, configured to rotate the semiconductor wafer, or configured to move the semiconductor wafer in a plurality of non-parallel directions.

The apparatus may further include a container housing the support, the foam manifold, the form, and the actuator or may include a channel through which liquid resulting from collapse of the jammed foam is removed from the surface of the semiconductor wafer.

The apparatus may further include a plurality of manifolds configured to introduce the foam to the semiconductor wafer, one or more manifolds configured to dry the semiconductor wafer after the semiconductor wafer has been subjected to the jammed foam, one or more manifolds configured to create the foam prior to the foam being supplied to the foam manifold, or one or more manifolds configured to dispense the foam to the foam manifold.

The following figures and detailed description of the preferred embodiments will more clearly demonstrate these and other objects and advantages of the invention.

BRIEF DESCRIPTION OF THE DRAWINGS

FIGS. 3A and 3B show views of the bubbles before and after rearrangement in an aspect of the present invention.

DETAILED DESCRIPTION OF THE PRESENTLY PREFERRED EMBODIMENTS

Figure 1:
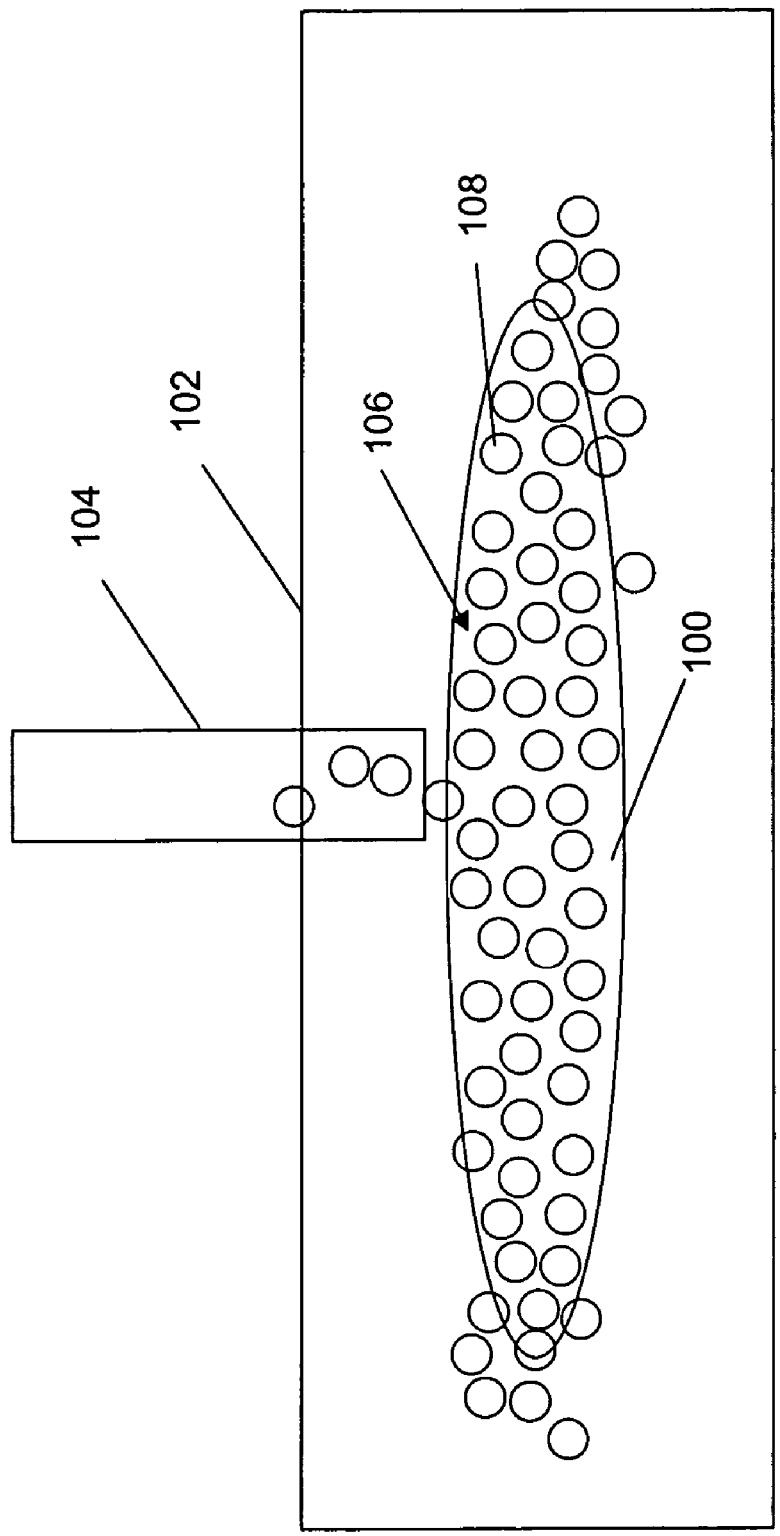
FIG. 1 illustrates a view of a known foam apparatus.

The use of foam in treating semiconductor wafers is advantageous for a number of reasons, most notably the ability to treat the surface of the semiconductor wafer without the use of large physical forces that are likely to destroy fine structures. Furthermore, a foam-based cleaning system is capable of removing more particles than it generates, unlike other systems whose particle count may increase in successive processing steps.

The process of creating a foam is relatively simple: a suitable liquid is transformed into foam by mixing a gas with the liquid. A suitable liquid is one in which the desired foam can be produced and provides the desired chemical treatment to the semiconductor wafer as the liquid phase of the foam is substantially identical to the original liquid used to create the foam. Foam can be produced by mixing of non-soluble gases, like air, or by decompression of solutions containing soluble gases into the liquid. In either case, energy is added to the mixture to form the foam.

Foams are in a metastable state when generated. This means that immediately following production, the foam starts to decay, thereby essentially reproducing the gas and the original liquid. This decay process is called draining. The rate of draining, called the drain time, varies depending on the foam. For example, the drain time for foams having the consistency of shaving cream may be hours while that of foams having the consistency of shampoo may be minutes or less. The drain time can be controlled by altering the type of liquid composing the foam and the density of the foam, for example, as desired to aid in the treatment of the semiconductor wafer.

The foam may be created or stored in a pressurized environment. Once released from this pressurized environment, e.g. from a storage facility through a manifold, the foam expands in volume. When applied through the manifold to the semiconductor wafer, such a foam reduces the volume of reactants and solvents in the liquid that contact the semiconductor wafer. However, the foam also reduces the exposure of the semiconductor wafer to contaminants in the conduits through which the foam has been transferred to the semiconductor wafer as less material passes through the conduits. Foams also exhibit thixotropic flow properties, and thus flow best under shear. Some foams, such as those having properties similar to shaving cream, spread easily under high shear but remain substantially stationary when the shear force is removed. Under low shear foam generally acts like solid, having elastic properties. In addition, as the walls of the bubbles in the foam provide surface tension, the use of liquids with low surface tension and low viscosity permit penetration of typical structures fabricated on the semiconductor wafers, such as vias and trenches.

Both the types of liquids and gases that form the foam, as well as the environmental factors present during foam generation, such as temperature and pressure, may be adjusted to control the foam composition. For example, the use of high purity liquids, e.g. water or chemicals used for other types of chemical treatments (for example etching), increases the effectiveness of the foaming as few contaminants are present to interfere with foaming. For example, addition of an agent that reduces surface tension such as soaps, detergents, isopropyl alcohol, nitrous oxide, isobutane, or carbon dioxide may also be added to the liquid when forming the foam. Additionally, as foaming is better at warmer temperatures due to the decrease in surface tension, the temperature of the liquid used can be adjusted to optimize foaming behavior. In one embodiment, the drain time of a suitable foam may be less than one or two minutes. Accordingly, it is possible to use relatively fast-draining foams. In fact the use of somewhat fast-draining foams may be desirable in that few, if any, additional such foams avoid the need for additional measures to remove it.

The technique suggested to clean the semiconductor wafer, as shown in FIG. 1, has been to immerse the semiconductor wafer in the foam or otherwise allow the foam to move over the surface of the substrate through decay and drainage. Decompression of the foam during the drainage transfers energy to the surface of the semiconductor wafer as the bubbles collapse. However, this technique releases too little energy when the foam bubble collapses to remove the contamination from the surface of the semiconductor wafer.

Figure 2:
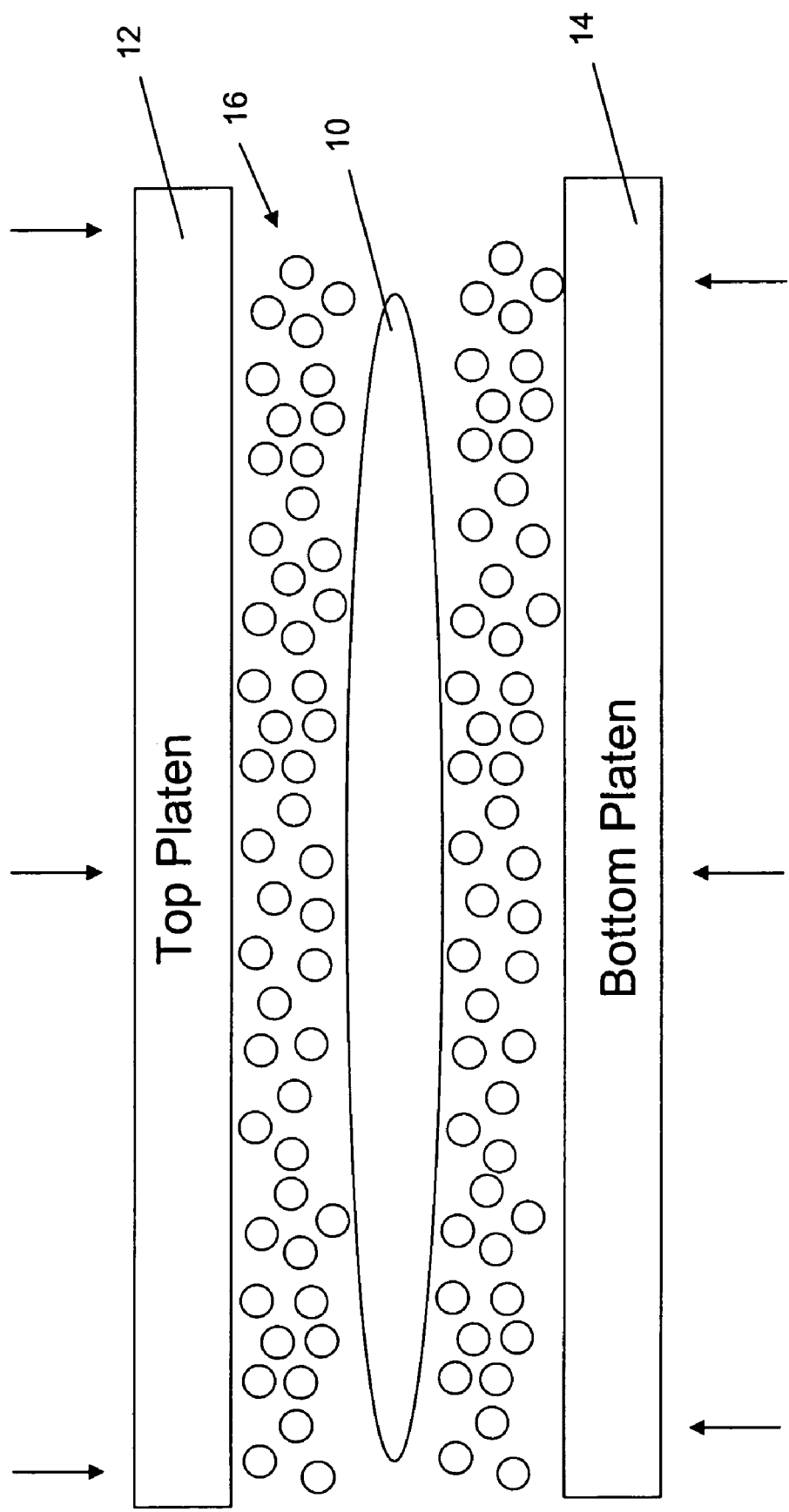
FIG. 2 shows a view of a cleaning apparatus according to a first aspect of the present invention.

The embodiment of the present invention illustrated in FIG. 2, however, uses a so-called "jammed" foam to clean or otherwise treat the semiconductor wafer. In this embodiment, the semiconductor wafer 10 is disposed between two platens 12, 14 and foam 16 is disposed on one or both sides of the semiconductor wafer 10 (as shown in the figure, on both sides). Any of a number of types of semiconductor wafers may be treated using the embodiments of the present invention, for example, silicon or other group IV substrates or III-V or II-VI compound semiconductor substrates.

In general, the bottom platen 14 provides a support on which the semiconductor wafer 10 is disposed, whether foam exists or not. The foam 16 is disposed over substantially the entire surface of the semiconductor wafer 10 on which it is present. The foam can be applied and spread on by any appropriate means such as one or more manifolds. As shown, uniform pressure is applied to the foam 16 through the top platen 12 and perhaps bottom platen 14. This pressure creates a jammed foam 16 that transfers energy to the semiconductor wafer 10 primarily through the rearrangement of the bubbles in the foam 16, rather than primarily through the collapse of the bubbles. The manner in which this is believed to occur is: as the pressure increases, the foam first enters a metastable high energy state in which no rearrangement occurs and then, at a critical stress level, the foam relaxes into a low energy state in which the energy is released not by the bubbles rupturing, but by rearranging the bubbles.

As the foam becomes jammed, the foam layer gets thinner and thinner until it reaches a minimum thickness. The minimum thickness is dependent on the liquid and gas components used, however as typically bubbles 10-50 μm in diameter may be used to treat the semiconductor surface, the layer thickness may not be less than the bubble diameter. In addition, if the density of the foam is too small, gravity will pull the bubbles apart and rupture the bubbles before they reach the interface and are able to be rearranged. Furthermore, as smaller bubbles are more stable than larger bubble, providing a foam with smaller bubbles may enhance the treatment efficiency by increasing the number of bubbles being rearranged at the interface.

In general, the upper surface of the semiconductor wafer 10 contains the patterned structures that require cleaning or other chemical treatment. Thus, if lower surface of the semiconductor wafer 10 does not require treatment, the bottom platen 14 may be removed and replaced with a fixed support structure that merely supports the semiconductor wafer 10 and does not provide pressure to the semiconductor wafer 10. In this case, the foam 16 may not be disposed on the lower surface of the semiconductor wafer 10. The supporting surface may be stationary or moving, similar to a conveyer belt. The platen, meanwhile, can be formed using any suitable material that is strong enough to withstand energy transferred to the platen by the repeated exposure to the collapsing bubbles.

A typical rearrangement is illustrated in FIGS. 3A and 3B. In FIG. 3A, the foam 16 is disposed on the surface of the semiconductor wafer 10 without pressure being applied. FIG. 3B shows the rearrangement of the foam 16 as pressure is applied (the platen or other pressing structure is not shown in this figure). As can be seen, energy is released when the foam 16 proceeds from a higher-energy, more disordered state, to a lower energy, more ordered state. The spherical nature of the bubbles shown in the figures tends to induce the foam to rearrange in a hexagonal close-packed structure.

After the treatment process using the foam is completed, the foam may be removed (or rinsed off) using DI water or may also require an additional liquid chemical rinse before the DI water rinse, for example. The remaining DI water may then be removed in a controlled manner by applying nitrogen or other inert gasses to the semiconductor wafer surface. An uncontrolled drying process, i.e. permitting the semiconductor wafer to dry without removing the foam, can leave the contaminants removed by the foam or unwanted residue and chemicals of the foam itself. Further processing can then take place, and, if desired a new foam may be later introduced onto the surface of the semiconductor wafer. The new foam may have the same or a different chemistry as the original foam as appropriate. The foam is generally not recycled after it has been used as it contains contaminants and resultants of reactions with the surface of the semiconductor wafer.

Figure 4:
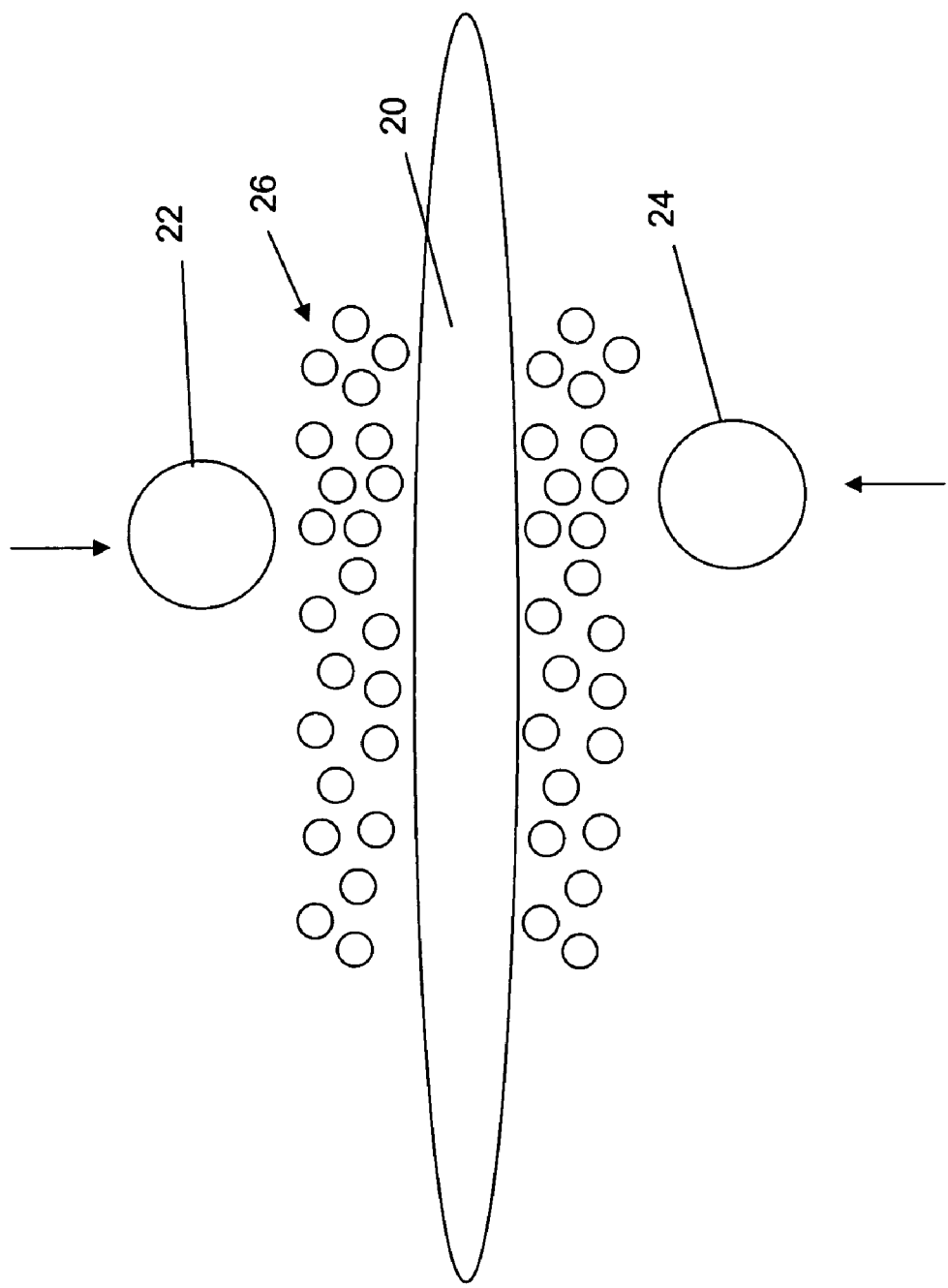
FIG. 4 shows a view of a cleaning apparatus according to a second aspect of the present invention.

Although the platen shown in FIG. 2 covers the entire semiconductor wafer, thus supplying a uniform pressure to the foam, pressure does not need to be uniformly applied to the foam. As illustrated in the embodiment shown in FIG. 4, the semiconductor wafer 20 and foam 26 is disposed between one or more forms 22, 24. In the embodiment of FIG. 4, pressure is applied to the foam 26 only over a small portion of the surface of the semiconductor wafer 20 through the forms 22, 24. Unlike the platens in the embodiment of FIG. 2, the forms 22, 24 of this embodiment do not cover substantially the entirety of the surface of the semiconductor wafer 20 to which they are opposed. Similar to the previous embodiment, only one form may be applied to the semiconductor wafer 20. This single form, as the single platen, is disposed over the upper surface of the semiconductor wafer 20, where the patterns that require cleaning or other treatment are present. Although not illustrated in this embodiment, multiple forms (platens, rollers, etc.) may be disposed on one surface of the semiconductor wafer 20.

The foam 26 in the embodiment of FIG. 4 may or may not be disposed over the entirety of the surface of the semiconductor wafer 20. In the latter case, the foam 26 may be disposed over only that portion of the semiconductor wafer 20 that requires cleaning or treatment. The forms 22, 24 may be moved across the surface of the semiconductor wafer 20 at least once or back and forth. If multiple forms exist, either over the same surface or opposing surfaces of the semiconductor wafer, the forms may be moved across the surface(s) of the semiconductor wafer in unison or separately, as desired. As shown, the forms 22, 24 may be mandrels, rollers, wheels, or any other pressure structure that covers only a portion of the semiconductor wafer 20. Thus, the forms may be flat or curved.

Note that curved forms may also be easier to implement than flat forms. In addition, the time needed to clean or treat the semiconductor surface may make an impact on whether the form is flat or not. In this case, if only a short time is needed, a narrow line of contact with high pressure can be used and thus the form can roll along the foam. Conversely, if a long time is required, flat surface is probably better. In addition, if the drain time is relatively fast, any reactant contained within the foam will be applied to the semiconductor wafer as a liquid.

Figure 5:
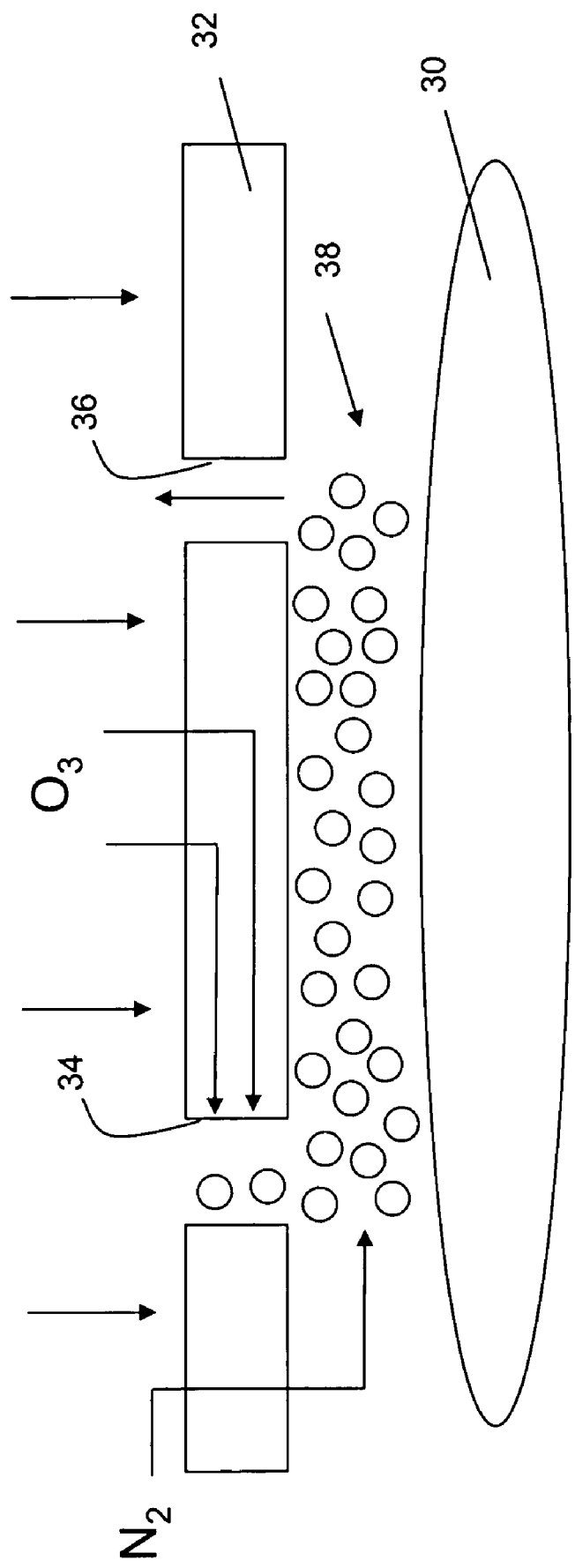
FIG. 5 shows a view of a cleaning apparatus according to a third aspect of the present invention.

FIG. 5 illustrates one manner in which the foam 38 is formed and moved. In this figure, only one pressure structure 32 (shown as a platen) is illustrated, it is evident, however, that multiple pressure structures may be used. As shown, the platen 32 has multiple holes 34, 36 formed that extend through the platen 32. Through at least one of these holes 34 (a foam manifold), the foam 38 is introduced to the surface of the semiconductor 30 and through at least another of these holes 36, the foam 38 exits from the semiconductor surface 30. The foam 38 may be deposited from the entrance hole 34 towards the exit hole 36 through drainage or, as shown, through the use of a non-reactive gas such as nitrogen. The nitrogen may push the foam 38 that is located on the surface of the semiconductor wafer 30 towards the exit hole 36. The movement of the foam 38 along with the rearrangement caused by the applied pressure cleans or treats the semiconductor surface 30. A vacuum or other pressure differential may be applied to the exit hole 36 to force the foam 34 or liquid from the decompressed foam to exit from the semiconductor surface 30. The holes 34, 36 may be positioned at any point along the platen 32, but are preferably disposed such that the foam is supplied over the entire surface of the semiconductor surface 30. Liquid is supplied through the entrance hole 34 and aerated by a gas (as shown $O_3$) to form the foam 38.

Figure 6:
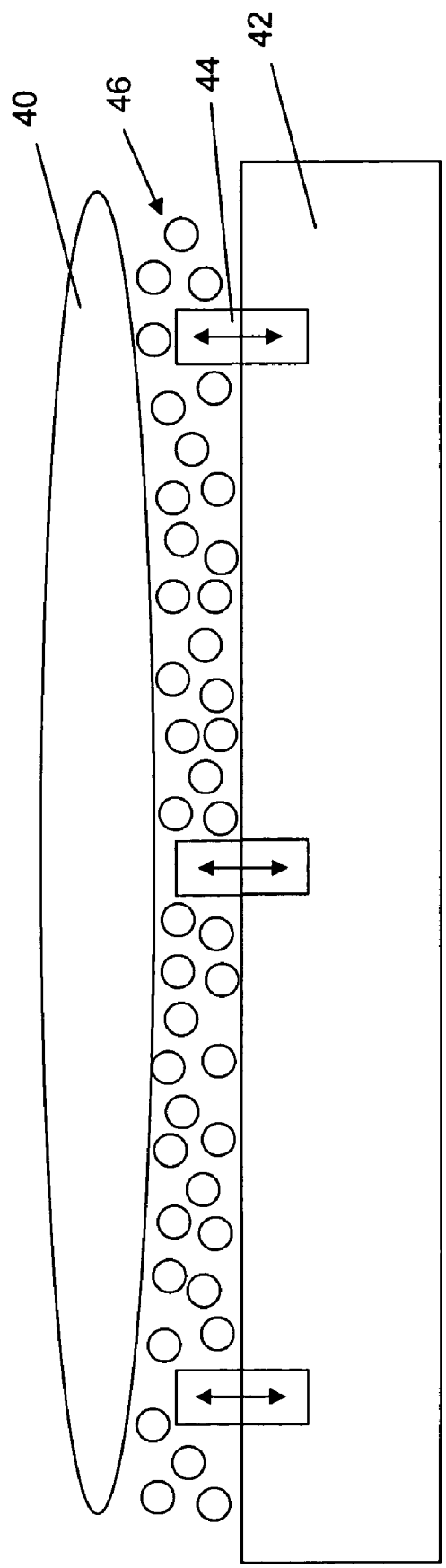
FIG. 6 shows a view of a cleaning apparatus according to a fourth aspect of the present invention.

FIG. 6 illustrates an embodiment in which the foam is present on both sides of the semiconductor wafer (although the foam on the upper surface and pressure structure are not shown). Foam 46 is introduced to the platen 42 (or other support) prior to the semiconductor wafer 40 being disposed on the foam 46. The semiconductor wafer 40 is then placed on three or more stands 44 of the support 42. The stands 44 are identical in size and shape and extend from the support 42 through the foam 46. Once the semiconductor wafer 40 is securely placed on the stands 44, the stands 44 may be retracted into the support 42 so that the semiconductor wafer 40 lies on the foam 46. An additional layer of foam may be applied to the opposing surface of the semiconductor wafer before or after the stands are retracted. After the foam is injected, the semiconductor wafer 40 may then be treated.

Figure 7:
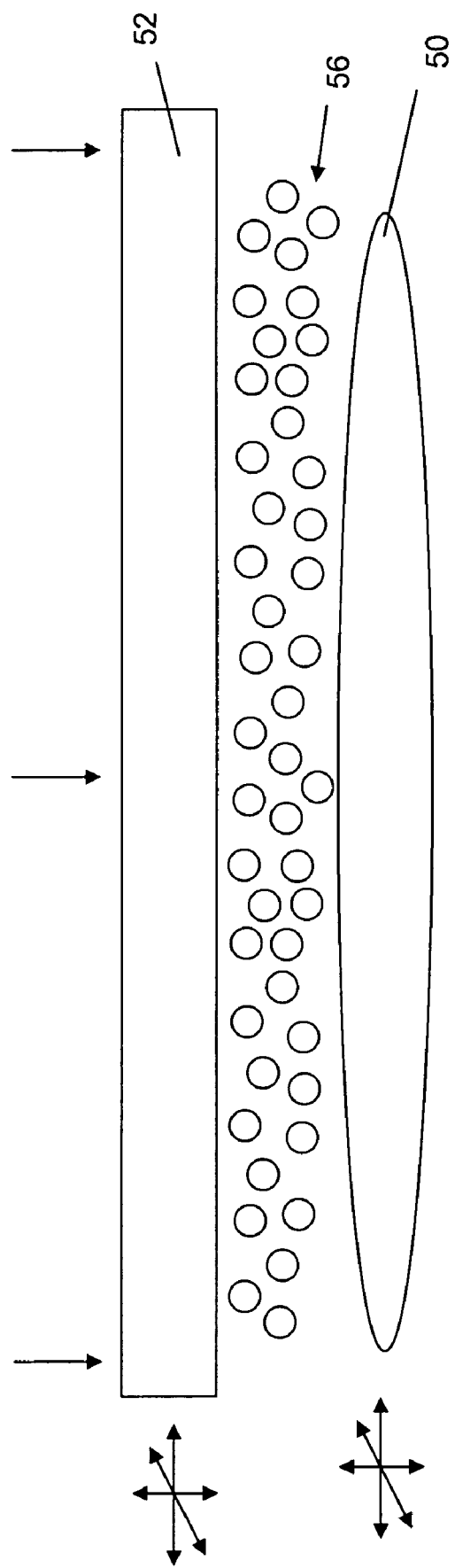
FIG. 7 shows a view of a cleaning apparatus according to a fifth aspect of the present invention.

FIG. 7 meanwhile, illustrates another embodiment of the present invention. In this embodiment, although the foam 56 may be disposed on both opposing surfaces of the semiconductor wafer 50 or multiple pressure mechanisms may be used, for simplicity, the foam 56 is shown as being disposed on only one surface of the semiconductor wafer 50 and a platen 52 to which pressure is applied is disposed on the foam 56. As noted above, foams flow best under shear. Thus, while pressure may be used to provide a shearing force, the platen 52 or platen 52 and semiconductor wafer 50 may be moved the increase the effectiveness of the foam 56 on the semiconductor wafer 50.

As shown, the semiconductor wafer 50 and platen 52 can be translated in one or more directions, laterally (i.e. in the plane of the semiconductor) or vertically, with respect to each other. This is to say that the foam 56 can be compressed and expanded by vertical movement, i.e. the semiconductor wafer 50 and platen 52 can be moved towards or away from each other. Alternatively, the foam 56 can be sheared by lateral movement, i.e. the semiconductor wafer 50 and platen 52 can be moved to adjust the overlap between the two. This movement is preferably repeated, i.e. the semiconductor wafer 50 and platen 52 are oscillated in one or more directions to induce more efficient treatment. Similarly, the semiconductor wafer 50 and/or platen 52 may be rotated to effect movement rather than the positions of the two being adjusted relative to each other. However, as rotation creates different linear speeds at different radii, oscillation may give better processing results. In summary, the semiconductor wafer location may remain constant and the form moved, the form location may remain constant and the semiconductor wafer moved, or both the semiconductor wafer and the form may be simultaneously or sequentially moved.

In the above embodiments, only a single wafer is disposed between the form and support (or between the forms). In other embodiments, multiple semiconductor wafers may be disposed between the form and support or between the forms, with the semiconductor wafers sandwiching foam layers. In this case, however, it may be difficult to position the semiconductor wafers and, if movement is involved, get uniform motion between the semiconductor wafers (and thus uniform results).

As discussed above, the foam is comprised of a liquid and gas-filled bubbles. The foam can be a delivery medium for other materials as well as being useful themselves due to rearrangement. Besides merely applying energy to and cleaning the surface of the semiconductor wafer, other chemistries may be present in the foam. The foam can be formed from treatment fluids used in conventional semiconductor processes to enhance the process. Examples of such fluids include HCl, ammonium hydroxide, SC1, SC2, HF for stripping and undercutting oxide present on the surface of the semiconductor wafer to remove particles embedded in oxide, nitric acid, ammonium hydroxide and hydrogen peroxide. Other fluids may be used that aid in the cleaning of the surface. For example, when using a fluid with a high ph, with a negatively charged semiconductor surface, a particle that is positively charged and attached to surface, once removed by foam, becomes negatively charged, thereby inhibiting readhesion of the particle.

Not only can liquids with different chemistries be used to aid processing of the semiconductor wafer, but the a reactive gas may be used to form the foam rather than an inert gas such as nitrogen, argon, air, or carbon dioxide. Such an arrangement provides a useful delivery system of the gas to the surface of the semiconductor.

Figure 8:
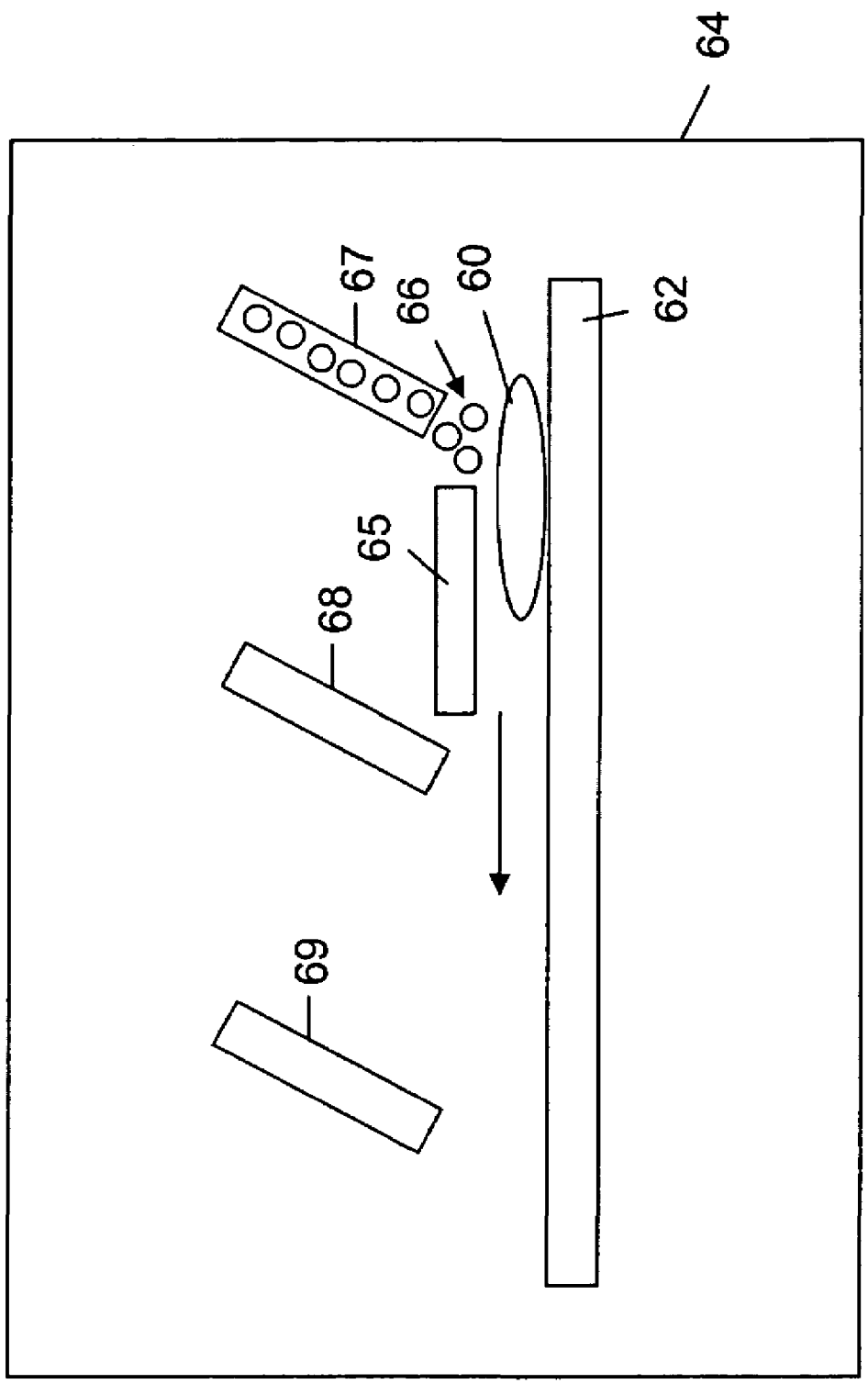
FIG. 8 shows a view of a cleaning apparatus according to a sixth aspect of the present invention.

FIG. 8 shows one embodiment of an apparatus using the foam treatment process. The semiconductor wafer 60 is supported by a support 62. The containment system 64, may have one or more chambers through which the semiconductor wafer 60 passes (only one is shown in the drawing). Multiple manifolds are present. At least one manifold creates the foam as shown in FIG. 4 for example. At least one manifold 67 introduces or dispenses the foam 66 to the semiconductor wafer 60. Gas and liquid supply lines (with appropriate valves) provide the ingredients for producing foam to the manifold. One or more manifolds 68 rinse the semiconductor wafer 60 in Dl water after the foam 66 has been applied and the form 65 has acted on the foam. After the semiconductor wafer 60 has been rinsed, one or more manifolds 69 dry the semiconductor wafer 60.

Of course, the same or different manifolds may distribute different foams, which are then pressurized to apply a jammed foam to the semiconductor. A drying process that uses foam can also be used. In such a process, a carbon dioxide gas/DI water mixture may provide the desired foam. Many other configurations of such an apparatus are possible, as is known in the semiconductor processing field. For example, the cleaning, chemical treatment and drying can take place either in the same or different chambers. Normally, the cleaning and chemical processing steps take place sequentially without any intermediate drying steps, and drying is carried out only as a final step when the semiconductor wafers are to be removed from the system. However, the cleaning and chemical treatment may be carried out alternately with drying in the same chamber.

While the invention has been described with reference to specific embodiments, the description is illustrative of the invention and not to be construed as limiting the invention. Various modifications and applications may occur to those skilled in the art without departing from the true spirit and scope of the invention as defined in the appended claims.

The invention claimed is:

1. An apparatus for treatment of a semiconductor wafer, the apparatus comprising:
    a support configured to support the semiconductor wafer;
    a foam manifold configured to create and introduce foam, directly, to a surface of the semiconductor wafer while the semiconductor wafer is supported by the support;
    a form substantially parallel to the wafer, wherein the form is configured to provide pressure to the foam disposed on the surface of the semiconductor wafer and to produce and maintain a jammed foam; and
    an actuator to effect relative movement between the form and the semiconductor wafer while the jammed foam is in contact with the surface of the semiconductor wafer to remove undesired particles from the surface of the semiconductor wafer.

2. An apparatus according to claim 1, wherein the form comprises a platen disposed on the foam and the platen has an area at least that of the semiconductor wafer such that the pressure is provided to the foam over the entire surface of the semiconductor wafer.

3. An apparatus according to claim 1, wherein the form comprises a pressure structure that is smaller than the entire surface of the semiconductor wafer such that the pressure is provided to the foam in a local area over the surface of the semiconductor wafer.

4. An apparatus according to claim 1, wherein the actuator is configured to move the form while a position of the semiconductor wafer is substantially maintained.

5. An apparatus according to claim 1, wherein the actuator is configured to vertically oscillate one of the form and the semiconductor wafer such that a distance between the form and the surface of the semiconductor wafer is varied.

6. An apparatus according to claim 1, wherein the actuator is configured to laterally oscillate one of the form and the semiconductor wafer in a plurality of non-parallel directions.

7. An apparatus according to claim 1, wherein the actuator is configured to rotate one of the form and the semiconductor wafer.

8. An apparatus according to claim 1, wherein the apparatus is configured to provide an additional layer of jammed foam between the semiconductor wafer and the support.

9. An apparatus according to claim 1, further comprising a channel through which liquid resulting from collapse of the jammed foam is removed from the surface of the semiconductor wafer.

10. An apparatus according to claim 1, wherein the foam comprises a liquid and bubbles, the liquid containing a chemical providing a chemical treatment to the semiconductor wafer.

11. An apparatus according to claim 10, wherein the liquid is configured to etch the semiconductor wafer or a layer disposed on the semiconductor wafer.

12. An apparatus according to claim 10, wherein the liquid contains cleaning agents suitable to clean the semiconductor wafer.

13. An apparatus according to claim 1, wherein the foam comprises bubbles that contain a reactive gas.

14. An apparatus according to claim 1, further comprising a manifold configured to one of: introduce the foam to the semiconductor wafer, apply de-ionized water (DIW) to the semiconductor wafer after the semiconductor wafer has been subjected to the jammed foam, apply a chemical treatment and DIW to the semiconductor wafer after the semiconductor wafer has been subjected to the jammed foam, apply an inert gas to the semiconductor wafer after the semiconductor wafer has been subjected to the jammed foam, create the foam prior to the foam being supplied to the foam manifold, and dispense the foam to the foam manifold.

15. An apparatus for treatment of a semiconductor wafer, the apparatus comprising:
    a support to support the semiconductor wafer;
    means for creating and introducing foam directly to a surface of the semiconductor wafer while the semiconductor wafer is supported by the support;
    means for providing pressure to the foam disposed on the surface of the semiconductor wafer to produce and maintain a jammed foam, where the means for providing pressure to the foam is substantially parallel to the semiconductor wafer; and
    means for effecting relative movement between the means for providing pressure to the foam and the semiconductor wafer while the jammed foam is in contact with the surface of the semiconductor wafer to remove undesired particles from the surface of the semiconductor wafer.

16. An apparatus according to claim 15, wherein the pressure means comprises a platen disposed on the foam and the platen has an area at least that of the semiconductor wafer such that the pressure is provided to the foam over the entire surface of the semiconductor wafer.

17. An apparatus according to claim 15, wherein the pressure means comprises a pressure structure that is smaller than the entire surface of the semiconductor wafer such that the pressure is provided to the foam in a local area over the surface of the semiconductor wafer.

18. An apparatus according to claim 15, wherein the movement means is configured to oscillate one of the pressure means and the semiconductor wafer to change one of a distance between the pressure means and the surface of the semiconductor wafer and an amount of overlap between the pressure means and the surface of the semiconductor wafer.

19. An apparatus according to claim 15, wherein the apparatus is configured to provide an additional layer of jammed foam between the semiconductor wafer and the support.

20. An apparatus according to claim 15, wherein the foam comprises a liquid and bubbles, the liquid containing a chemical providing a chemical treatment to the semiconductor wafer.

21. An apparatus according to claim 15, wherein the foam comprises bubbles that contain a reactive gas.

* * * * *